United States Patent
Chou et al.

(10) Patent No.: US 9,653,507 B2
(45) Date of Patent: May 16, 2017

(54) DEEP TRENCH ISOLATION SHRINKAGE METHOD FOR ENHANCED DEVICE PERFORMANCE

(71) Applicant: Taiwan Semiconductor Manufacturing Co., Ltd., Hsin-Chu (TW)

(72) Inventors: Cheng-Hsien Chou, Tainan (TW); Shih Pei Chou, Tainan (TW); Chih-Yu Lai, Tainan (TW); Sheng-Chau Chen, Tainan (TW); Chih-Ta Chen, Tainan (TW); Yeur-Luen Tu, Taichung (TW); Chia-Shiung Tsai, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 101 days.

(21) Appl. No.: 14/314,193

(22) Filed: Jun. 25, 2014

(65) Prior Publication Data
US 2015/0380447 A1   Dec. 31, 2015

(51) Int. Cl.
*H01L 27/146*   (2006.01)
*H01L 33/20*   (2010.01)

(52) U.S. Cl.
CPC ...... *H01L 27/1463* (2013.01); *H01L 27/1462* (2013.01); *H01L 27/14685* (2013.01); *H01L 27/14687* (2013.01); *H01L 33/20* (2013.01)

(58) Field of Classification Search
CPC ......... H01L 27/1463; H01L 21/823481; H01L 27/1462; H01L 27/14685; H01L 27/14687;
(Continued)

(56) References Cited

U.S. PATENT DOCUMENTS 4,685,198 A * 8/1987 Kawakita ............. H01L 21/762
148/DIG. 115
4,845,048 A * 7/1989 Tamaki ............. H01L 21/76264
148/DIG. 117
(Continued)

FOREIGN PATENT DOCUMENTS

TW            400614 B      8/2000

OTHER PUBLICATIONS

Goushcha, et al. "Optical and Electrical Crosstalk in PIN Photodiode Array for Medical Imaging Applications." IEEE NSS2007 Paper M26-136. Nov. 5, 2007.
(Continued)

*Primary Examiner* — Julio J Maldonado
*Assistant Examiner* — Farun Lu
(74) *Attorney, Agent, or Firm* — Eschweiler & Potashnik, LLC

(57) ABSTRACT

Some embodiments of the present disclosure relate to a deep trench isolation (DTI) structure configured to enhance efficiency and performance of a photovoltaic device. The photovoltaic device comprises a functional layer disposed over an upper surface of a semiconductor substrate, and a pair of pixels formed within the semiconductor substrate, which are separated by the DTI structure. The DTI structure is arranged within a deep trench. Sidewalls of the deep trench are partially covered with a protective sleeve formed along the functional layer prior to etching the deep trench. The protective sleeve prevents etching of the functional layer while etching the deep trench, which prevents contaminants from penetrating the pair of pixels. The protective sleeve also narrows the width of the DTI structure, which increases pixel area and subsequently the efficiency and performance of the photovoltaic device.

21 Claims, 8 Drawing Sheets

(58) Field of Classification Search
CPC ... H01L 33/20; H01L 21/28123; H01L 21/76; H01L 21/7602; H01L 21/7605; H01L 21/7607; H01L 21/761; H01L 21/762; H01L 21/76202; H01L 21/76205; H01L 21/7621; H01L 21/76213; H01L 21/76218
USPC .................. 438/445, 424, 702, 437, 952
See application file for complete search history.

(56) References Cited

U.S. PATENT DOCUMENTS

| | | | | |
|---|---|---|---|---|
| 5,112,771 | A * | 5/1992 | Ishii | H01L 21/3081 257/E21.232 |
| 5,262,002 | A * | 11/1993 | Grewal | H01L 27/10861 148/DIG. 50 |
| 5,915,192 | A * | 6/1999 | Liaw | H01L 21/76232 148/DIG. 50 |
| 6,140,208 | A * | 10/2000 | Agahi | H01L 21/76224 257/E21.546 |
| 6,165,871 | A * | 12/2000 | Lim | H01L 21/76232 257/E21.438 |
| 6,180,488 | B1 * | 1/2001 | Kim | H01L 21/28123 257/E21.206 |
| 6,180,493 | B1 * | 1/2001 | Chu | H01L 21/76224 257/E21.546 |
| 6,214,696 | B1 * | 4/2001 | Wu | H01L 21/76227 257/E21.547 |
| 6,232,202 | B1 * | 5/2001 | Hong | H01L 21/76232 257/E21.549 |
| 6,313,008 | B1 * | 11/2001 | Leung | H01L 21/76232 257/510 |
| 6,350,657 | B1 * | 2/2002 | Mastromatteo | H01L 21/3065 257/E21.218 |
| 6,723,618 | B2 * | 4/2004 | Meyer | H01L 21/76205 257/E21.553 |
| 7,518,172 | B2 * | 4/2009 | Moon | H01L 27/14625 257/292 |
| 7,541,659 | B1 * | 6/2009 | Nam | H01L 27/14649 257/292 |
| 7,981,303 | B2 * | 7/2011 | Bring | B81C 1/00174 216/2 |
| 8,383,489 | B2 * | 2/2013 | Huang | H01L 21/76254 257/E21.546 |
| 2006/0180885 | A1 * | 8/2006 | Rhodes | H01L 27/14601 257/432 |
| 2008/0102557 | A1 * | 5/2008 | Kim | H01L 21/76224 438/73 |
| 2009/0230488 | A1 | 9/2009 | Ando | |
| 2012/0104539 | A1 * | 5/2012 | Mehrotra | H01L 21/76232 257/506 |
| 2013/0102125 | A1 * | 4/2013 | Venigalla | H01L 21/3081 438/437 |
| 2014/0106163 | A1 * | 4/2014 | Coue | G02B 1/105 428/331 |
| 2014/0110809 | A1 * | 4/2014 | Kitamura | H01L 27/14623 257/435 |
| 2014/0357039 | A1 * | 12/2014 | Liu | H01L 29/0649 438/296 |
| 2015/0001669 | A1 * | 1/2015 | Chou | H01L 21/76224 257/506 |
| 2015/0091121 | A1 * | 4/2015 | Manda | H01L 27/14621 257/443 |
| 2016/0056197 | A1 * | 2/2016 | Chen | H01L 27/1464 257/447 |
| 2016/0112614 | A1 * | 4/2016 | Masuda | H01L 27/14621 348/374 |

OTHER PUBLICATIONS

Donohue, et al. "Recent Improvements in Deep Silicon Etching." Plasma Therm Inc. Aug. 26, 2004.

* cited by examiner

DEEP TRENCH ISOLATION SHRINKAGE METHOD FOR ENHANCED DEVICE PERFORMANCE

BACKGROUND

The present disclosure relates to deep trench isolation techniques, such as used in photovoltaic devices.

Photovoltaic devices are used in a wide variety of electronics applications ranging from image sensors, to optical detectors, to telecommunications, etc. Many photovoltaic devices utilize an array of pixels, which include photodiodes that convert an image into digital data. A photodiode consists of a p-n junction arranged between an anode and a cathode. When incident radiation from an image is absorbed near a depletion region of the p-n junction, an electron-hole pair is created. The electron is drawn to cathode and the hole is drawn to the anode to produce a photocurrent.

Some photodiodes are formed directly on a semiconductor substrate alongside an integrated circuit during a semiconductor manufacturing process. These photodiodes provide an advantage of lower power consumption, smaller size, faster data processing, and lower manufacturing cost than photodiodes formed external to the semiconductor substrate. The properties of a photodiode formed on a semiconductor substrate are determined from the bandgap of the semiconductor substrate, because the bandgap determines what wavelengths of incident light will excite electron-hole pairs to produce the photocurrent.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
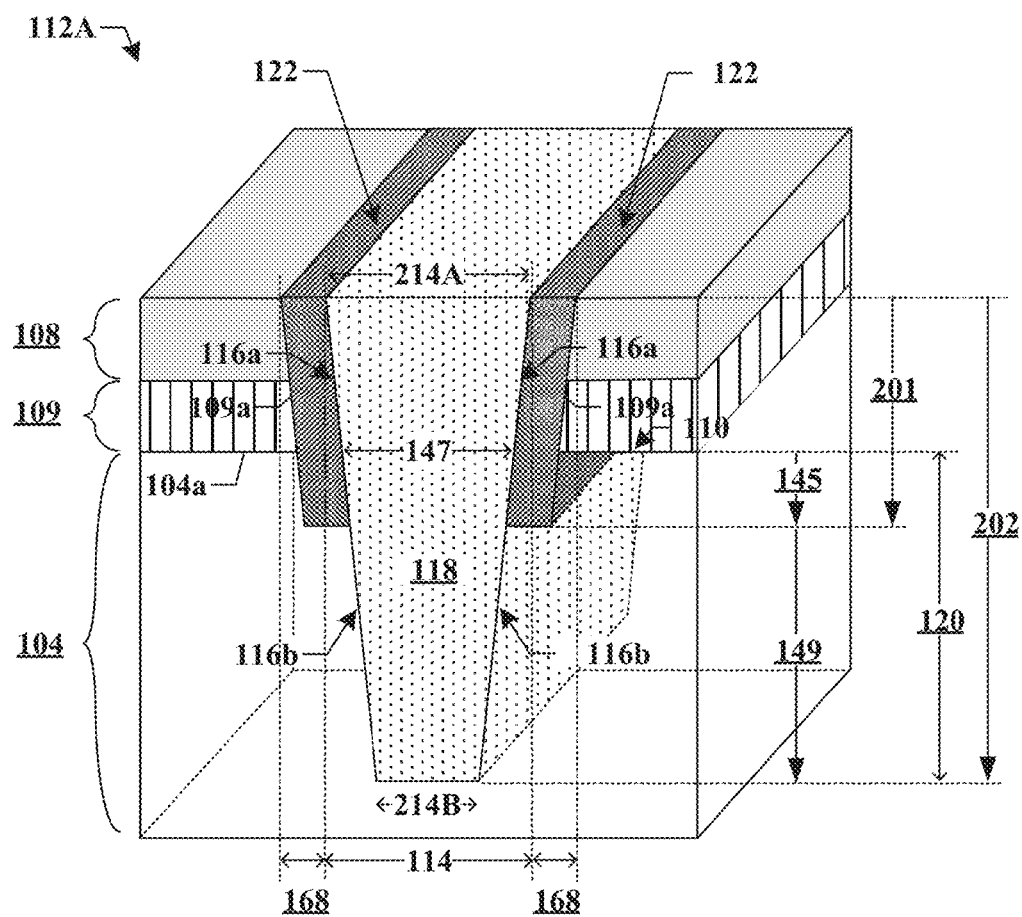
FIG. 1 illustrates a perspective view of a deep trench isolation (DTI) structure in accordance with some embodiments.

The following disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some semiconductor devices utilize deep trench isolation (DTI) structures to isolate neighboring active regions of a semiconductor substrate from one another. These DTI structures are formed by using an etch process to form a deep trench within the semiconductor substrate, which is then filled with a fill material. In some applications, a functional layer is disposed over an upper surface of the semiconductor substrate prior to etching the deep trench. The functional layer can enhance the performance of the semiconductor device, but also comprises one or more potential contaminants for the substrate. In some instances, the etch process used to form the deep trench dissociates these contaminants from the functional layer, and the dissociated contaminants then diffuse into the semiconductor substrate through sidewalls of the deep trench as the deep trench is being formed. These contaminants can degrade performance of the final semiconductor device, for example by lessening the isolation provided by the resultant DTI structure or by changing optical properties near an edge of the DTI structure.

Accordingly, some embodiments of the present disclosure relate to improved DTI structures, such DTI structure 112A as shown in FIG. 1. To mitigate contaminants from dissociating from a functional layer 109 into lower DTI sidewall regions 116b, the DTI structure 112A includes a protective capping layer 108 and a protective sleeve 122 arranged over a semiconductor substrate 104. During manufacturing, the capping layer 108 and protective sleeve 122 work cooperatively to limit dissociation of the functional layer 109 while the DTI structure 112A is formed. In particular, to form this DTI structure 112A, a first etch process forms a shallow trench which extends to depth 201. Because this first etch process etches away a portion of the functional layer 109 when forming this shallow trench, the first etch process can dissociate contaminants from the functional layer 109 as the functional layer 109 is being etched away. To limit the extent of any contaminants contaminating a deeper region of the DTI structure near lower DTI sidewalls 116b, the first etch stops shortly after the functional layer 109 has been fully removed from the shallow trench. The protective sleeve 122, typically in the form of a conformal protective liner, is then formed along upper DTI sidewalls 116a to cover exposed surfaces of the functional layer 109. While the protective sleeve 122 is in place, a second etch process, typically in the form of an anisotropic etch (e.g., unidirectional vertical etch), then extends the shallow trench from depth 201 to form a deep trench extending to depth 202. During this second etch process, the protective sleeve 122 remains in place to continuously cover the functional layer sidewalls 109a to prevent dissociation of contaminants from the functional layer 109. Therefore, unlike conventional DTI processes, the lower DTI sidewall regions 116b can be formed substantially free of contaminants arising from functional layer 109. A fill material 118, such as a continuous dielectric material or a dielectric liner with a tungsten core then fills the deep trench to form the final DTI structure 112A.

In some embodiments, DTI structure 112a has a deep trench width 114 in a range between about 0.05 and about 0.2 μm as measured between opposing deep trench sidewalls 116a. In some embodiments, the DTI structure 112A is arranged within a high-aspect-ratio deep trench having a first depth 120 greater than about 0.5 microns (μm) as measured from an upper substrate surface 104a. The deep trench can be tapered (i.e., narrows) along a direction 202, such that the width 114 has a maximum value 214A its top, and a minimum value 214B at its bottom. In some embodiments, the protective sleeve 122 has a sleeve width 168 in a range between about 0.001 μm and about 0.01 μm. Upper trench sidewalls of the DTI structure 112A can extend beneath the uppermost semiconductor surface 104a to an intermediate depth 145 and are spaced apart by a first trench width 147 at the uppermost semiconductor surface 104a, while lower trench sidewalls of the DTI structure 112a can extend from the intermediate depth 145 to a lowermost trench depth 149 and are spaced apart by the minimum value 214B, which may also be referred to as a second trench width 151 in some embodiments.

It will be appreciated that the protective sleeve 122 and corresponding manufacturing techniques, some examples of which are provided further below, can manifest themselves in a variety of different semiconductor device technologies. One particular technology where such a protective sleeve is advantageous is in the area of photovoltaic devices, as described below.

Figure 2A:
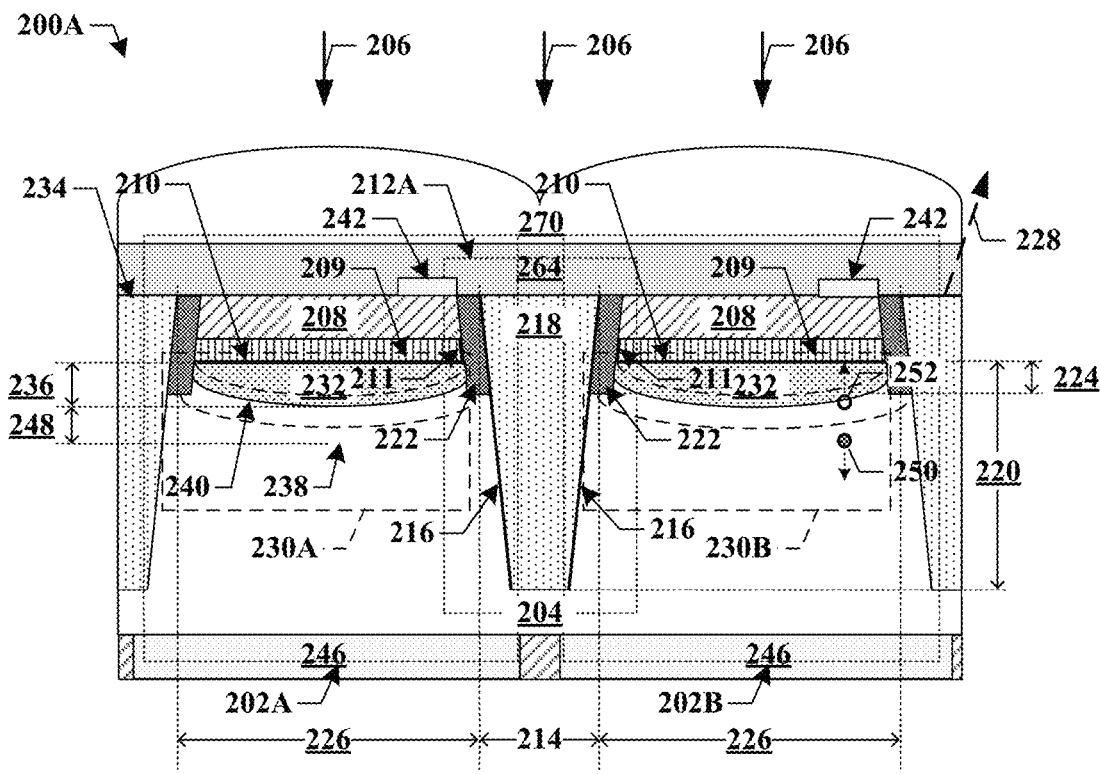
FIGS. 2A-2C illustrate cross-sectional views of photovoltaic devices in accordance with some embodiments.

FIG. 2A illustrates a cross-sectional view of a photovoltaic device 200A comprising first and second pixels 202A, 202B formed within a semiconductor substrate 204 (e.g., silicon, germanium, gallium arsenide, etc.), and separated by DTI structure 212A. The first and second pixels 202A, 202B include first and second photodiodes 230A, 230B, respectively, made up of a p-type region 232 formed within an n-type substrate region 204, such that a depletion region 238 is formed beneath an upper semiconductor surface 210 about opposite sides of p-n junction 240. During operation of photovoltaic device 200A, when incident radiation 206 of sufficient energy strikes the first or second photodiode 230A, 230B, it creates an electron-hole pair (i.e., electron 250 and hole 252). The hole 252 is accelerated toward anode 242, and the electron 250 is accelerated toward cathode 246 to produce a photocurrent. A color filter layer 264 is optionally disposed over an upper capping surface 234 of first and second pixels 202A, 202B, and a micro-lens 270 is optionally disposed over the color filter layer 264 in some embodiments.

The first and second pixels 202A, 202B include a functional layer 209 disposed over an upper semiconductor surface 210 of the semiconductor substrate 204, and a capping layer 208, such as an oxide (e.g., $SiO_2$) disposed over the functional layer 209. In some embodiments, the functional layer 209 comprises an antireflective coating, such as hafnium oxide ($HfO_2$) or an oxide and $HfO_2$ heterostructure ($Ox/HfO_2$) for example, to increase the amount of incident radiation 206 absorbed by the first and second pixels 202A, 202B.

The first DTI structure 212A comprises a fill material 218 (e.g., oxide, tungsten) disposed within a deep trench. The deep trench has a deep trench width 214 as measured between opposing deep trench sidewalls 216. The first DTI structure 212A is formed through the capping layer 208 and the functional layer 209, and extends beneath the upper semiconductor surface 210 to a first depth 220. A protective sleeve 222 (e.g., silicon oxide ($SiO_2$), silicon nitride (SiN)) is arranged partially along the sidewalls 216 of the deep trench (or equivalently, the first DTI structure 212A), between the fill material 218 and the functional layer 209. The protective sleeve 222 extends along the sidewalls 216 beneath the upper semiconductor surface 210 to a second depth 224, which is less than the first depth 220.

The protective sleeve 222 is configured to prevent etching of the functional layer 209, which prevents contaminants from the functional layer 209 from diffusing into the first and second pixels 202A, 202B through the sidewalls 216 of the deep trench during formation of the first DTI structure 212A, during the deep trench etch. To form the protective sleeve 222, a first etch process forms a recess within the protective and functional layers 208, 209, which extends to the second depth 224 below the upper semiconductor surface 210. The protective sleeve 222 is then formed along sidewalls 216 of the recess, and covers exposed surfaces 211 of the functional layer 209. After formation of the protective sleeve 222, a second etch process then extends the recess to form a deep trench with the first depth 220, while the protective sleeve 222 prevents contaminants from the functional layer 209 from penetrating the first or second pixel 202A, 202B through the sidewalls 216 of the deep trench.

For the embodiments of FIG. 2A, the protective sleeve 222 is illustrated as extending below the upper semiconductor surface 210 to ensure that the exposed surfaces 211 of the functional layer 209 are fully covered with some additional overlap margin of the protective sleeve 222 past the exposed surfaces 211. In some embodiments, however, the second depth 224 can be essentially zero (i.e., no additional overlap margin). The protective sleeve 222 has a lower edge that remains spaced apart from the bottommost surface of the deep trench. This spacing is present because the lower deep trench portion extending below the protective sleeve 222 (i.e., the first depth 220 minus the second depth 224) is formed by the second etch process, which occurs after formation of the protective sleeve 222.

As will be appreciated in more detail further herein (e.g., in the description of embodiments of FIGS. 3A-3F), the protective sleeve 222 also reduces the deep trench width 214 from an optical opacity standpoint. Adjacent pixels of the array can experience electrical crosstalk due to the diffusion of carriers (i.e., electrons or holes), created by the incident radiation 206 from an illuminated pixel to a neighboring pixel. Adjacent pixels can also experience optical crosstalk due to scattering of the incident radiation 206 from the illuminated pixel to the neighboring pixel. In order to mitigate against optical crosstalk, the fill material 218 is opaque to the incident radiation 206, and therefore absorbs or reflects the incident radiation 206. Consequently, the first DTI structure 212A in some regards reduces the amount of surface area on the semiconductor substrate 204 that can absorb the incident radiation 206. Therefore, in embodiments where the protective sleeve 222 is optically transparent, the presence of the protective sleeve 222 can reduce optical opacity over the deep trench width 214 and increases an effective width 226 of the first and second pixels 202A, 202B. This can increase the amount of incident radiation that can be absorbed by the photovoltaic device 200A, and consequently increases its quantum efficiency (QE).

Figure 2B:
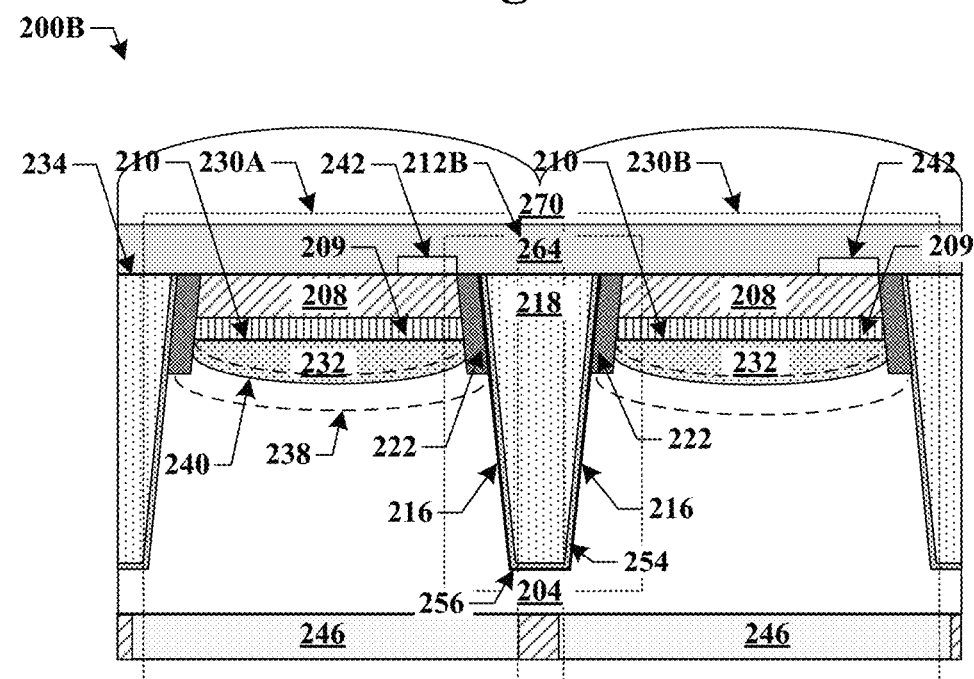
Figure 2C:
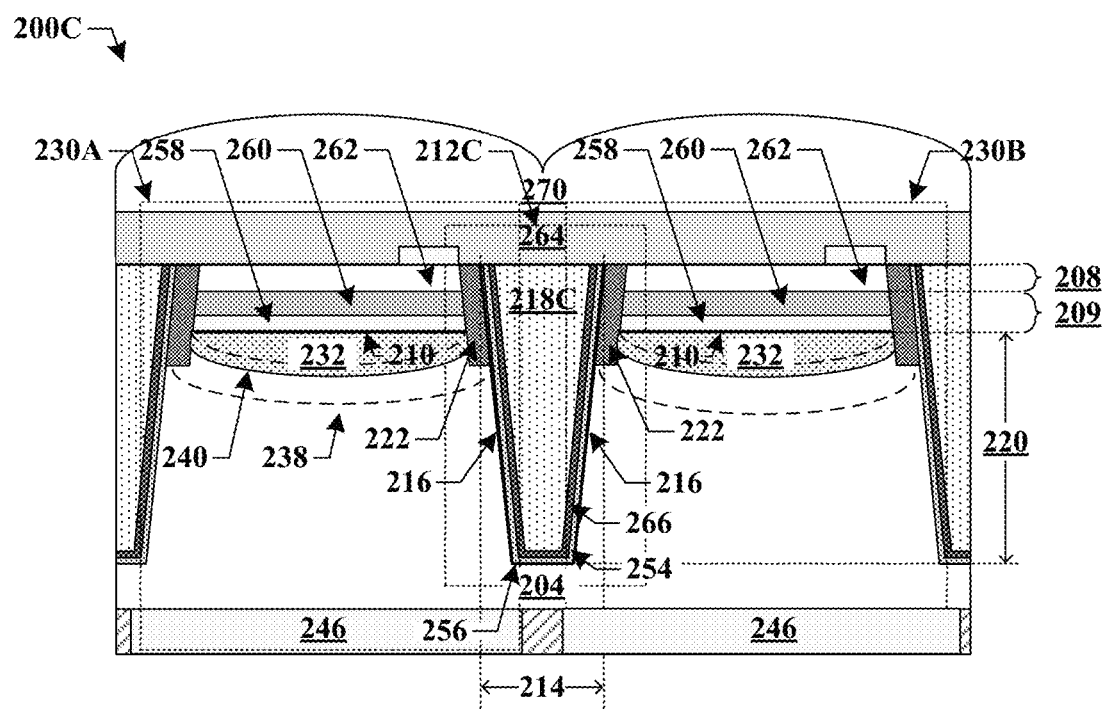

FIG. 2B illustrates a cross-sectional view of a photovoltaic device 200B, which is similar in many respects to FIG. 2A but which includes a dielectric liner 254 configured to trap charge and reduce dark current. Dark current is a condition that can degrade image quality and occurs when the photovoltaic device produces current even when light is not impingent on the photodiodes. To mitigate dark current, the dielectric liner 254 is disposed along a lower surface 256 and the sidewalls 216 of the deep trench prior to introducing the fill material 118. The dielectric liner 254 consequently separates the fill material 218 from the semiconductor substrate 204. In some embodiments, the dielectric liner 254 comprises $HfO_2$ and/or oxide (e.g., $SiO_2$). In some embodiments, the dielectric liner 254 comprises $HfO_2$ doped with aluminum (Al), tantalum (Ta), cobalt (Co), germanium (Ge), or other appropriate dopant. In some embodiments, the dielectric liner is formed on a lower surface and sidewalls of the deep trench, and between the sidewalls and the protective sleeve, to separate the fill material from the semiconductor substrate FIG. 2C illustrates a cross-sectional view of a photovoltaic device 200C comprising first and second photodiodes 230A, 230B that are separated by a third DTI structure 212C. The third DTI structure 212C includes a dielectric liner 254 to provide electrical isolation and/or charge trapping, as well as a tungsten body 218C filling a core region of the deep trench. In instances where the deep trench is a high-aspect-ratio deep trench, the deep trench may be problematic to fill with some conventional fill techniques and fill materials such as oxide. As such, the third DTI structure 212C uses tungsten (W) as the fill material 218C. Tungsten has an advantage over some conventional fill materials because its good fill-properties ease filling of the high-aspect-ratio trench, and because it can help prevent electric and optical crosstalk between the first and second photodiodes 230A, 230B. When tungsten is used as fill material 218C, a seed layer 266 comprising titanium nitride (TiN) is disposed over the dielectric liner 254 on the lower surface 156 and the sidewalls 216 of the deep trench. The seed layer 266 promotes tungsten deposition within the high-aspect-ratio deep trench.

Additionally, FIG. 2C shows an example where an anti-reflective layer 258, passivation layer 260, and capping layer are each disposed over the substrate 204. This configuration can also be used in other embodiments, although it was not illustrated for purposes of conciseness. In some embodiments of FIG. 2C, the anti-reflective layer 258 comprises hafnium oxide ($HfO_2$), or an oxide and $HfO_2$ heterostructure (Ox/$HfO_2$), configured to prevent reflection of incident radiation. In some embodiments, the passivation layer 260 comprises silicon nitride (SiN), silicon dioxide ($SiO_2$), titanium dioxide ($TiO_2$), or tantalum oxide ($Ta_2O_5$) configured to reduce electron-hole recombination near the upper semiconductor surface 210. The capping layer 262 can comprise an oxide, such as $SiO_2$, or a nitride, such as SiN, for example.

Figure 3A:
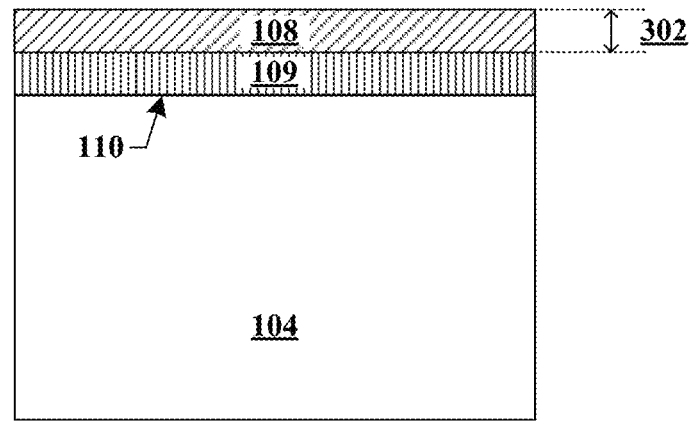
FIGS. 3A-3F illustrate a series of cross-sectional views that collectively depict forming a DTI structure in accordance with some embodiments.

FIGS. 3A-3F illustrates a series of cross-sectional views that collectively depict forming the DTI structure 112A. It is appreciated that formation of the other DTI structures of FIGS. 2A-2C follows by analogy. FIG. 3A illustrates a cross-sectional view a photovoltaic device 300 comprising a functional layer 109 disposed over an upper semiconductor surface 110 of a semiconductor substrate 104, and a capping layer 108 disposed over the functional layer 109. In some embodiments, the capping layer 108 comprises an oxide layer (e.g., $SiO_2$) with an oxide thickness 302 sufficient to withstand a CMP step (e.g., See FIG. 3F). In some embodiments, the oxide thickness 302 is in a range of about 1 µm to about 5 µm. In some embodiments, the functional layer 109 comprises $HfO_2$ configured as an anti-reflective coating. In some embodiments, the functional layer 109 further comprises $Ta_2O_5$ configured to passivate the upper semiconductor surface 110.

Figure 3B:
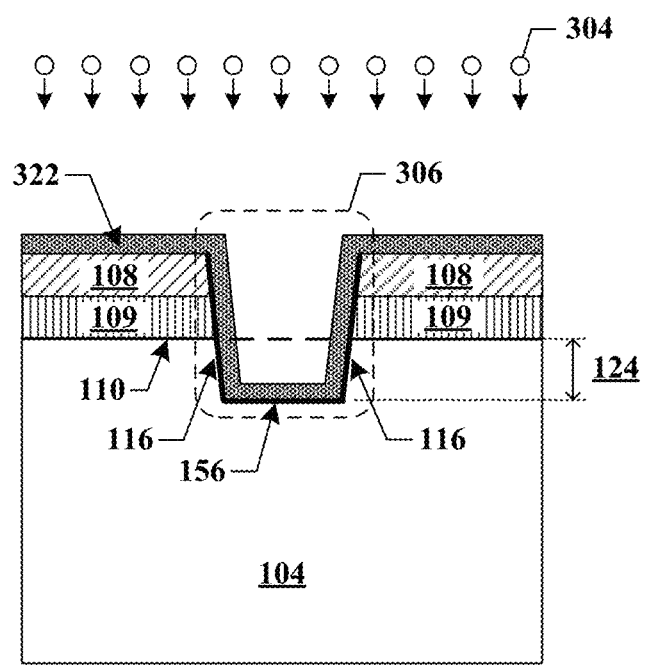

In FIG. 3B, an upper capping surface of the capping layer 108 is exposed to a first etchant 304 that forms a recess 306 within the capping and functional layers 108, 109. This recess 306 extends beneath the upper semiconductor surface 110 to a second depth 124. In some embodiments, the second depth 124 is zero such that a bottom surface of the recess 306 coincides with the upper semiconductor surface 110. In some embodiments, the first etchant 304 comprises a fluorine ($F_2$) based gas to insure a high-aspect-ratio for the recess 306. Various other wet and dry etchants may be used, including, but not limited to, chlorine ($Cl_2$) or hydrogen bromide (HBr). After formation of the recess, a protective layer 322 is disposed along a lower surface 156 and sidewalls 116 of the recess 306. In some embodiments, the protective layer 322 comprises oxide (e.g., $SiO_2$). In some embodiments, the protective layer 322 comprises nitride (e.g., SiN). In some embodiments, the protective layer 322 comprises a thickness in a range of about 0.001 µm to about 0.01 µm.

Figure 3C:
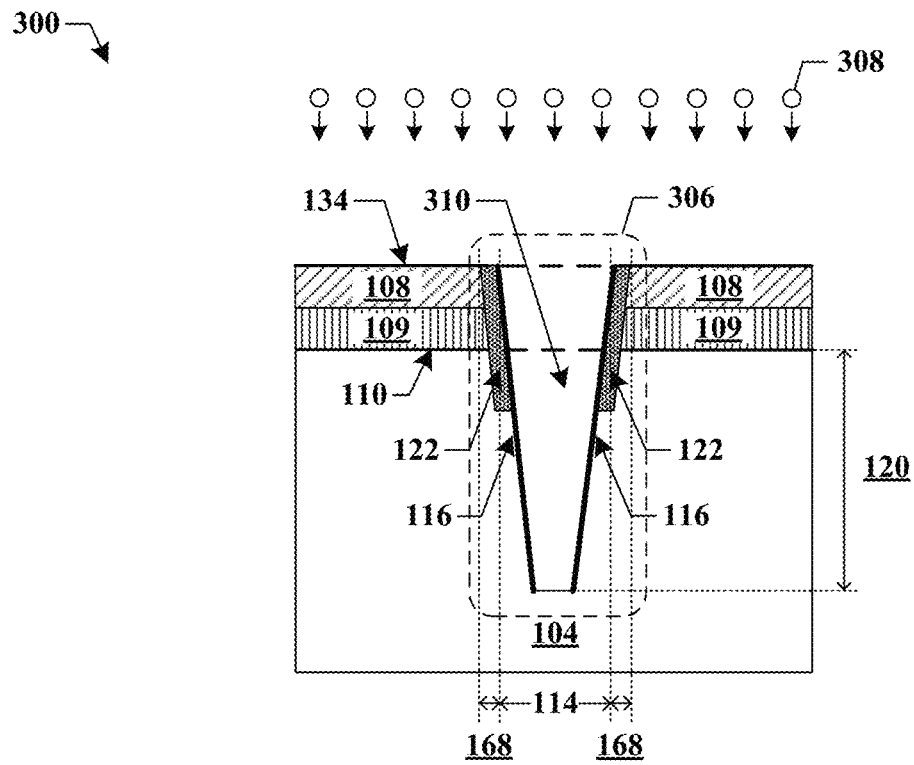

In FIG. 3C, the structure is exposed to a second etchant 308 that further extends the recess 306 below the upper semiconductor surface 110 to a second depth 120, to form a deep trench 310. The second etchant 308 etches away portions of the protective layer 322 disposed along a lower surface 156 of the recess 306, while leaving portions of the protective layer 322 disposed on the sidewalls 116 substantially intact to form a protective sleeve 122. This protective sleeve 122 protects the sidewalls 116 and prevents etching of the functional layer 109 by the second etchant 308. The protective sleeve 122 also reduces the deep trench width 114 of the recess 306 prior to exposing the semiconductor substrate 104 to the second etchant 308, such that the deep trench 310 has a deep trench width 114 as measured between inside edges of the protective sleeve 122.

In some embodiments, the second etchant 308 comprises a fluorine ($F_2$) based gas to ensure a high-aspect-ratio for the deep trench. It is appreciated that fluorine-based etch chemistries are utilized to achieve high-aspect-ratio trenches within a silicon (Si) substrate due to their high efficiency free radical disassociation and resulting high etch rates. However, the fluorine based etch is essentially an isotropic process. Consequently, the protective layer 322 helps to achieve anisotropy while etching with the second etchant, to maintain a high-aspect-ratio deep trench 310.

Figure 3D:
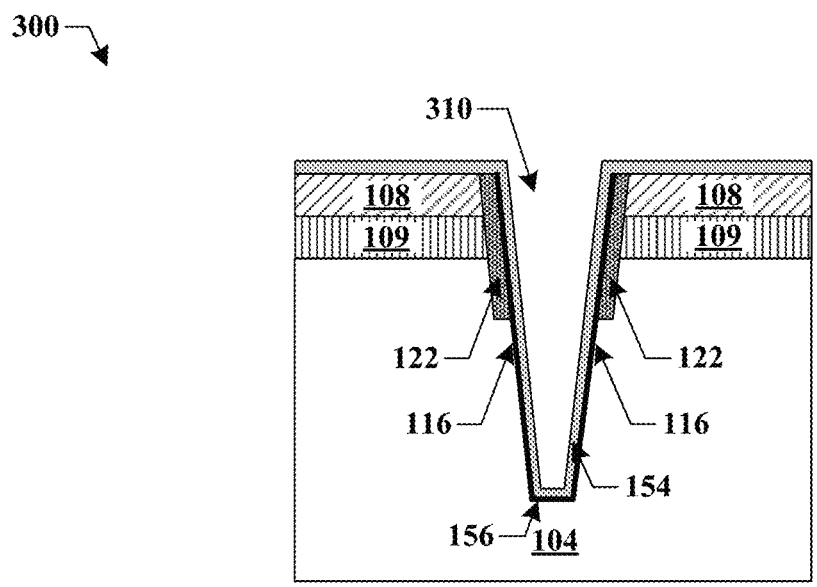

In FIG. 3D, a dielectric liner 154 is disposed along the upper capping surface 134, sidewalls 116, and lower surface 156 of the deep trench 310. In some embodiments, the dielectric liner 154 comprises $HfO_2$ configured to act as a charge-trapping layer to minimize dark current within the photovoltaic device 300. In some embodiments, the dielectric liner 154 comprises a thickness in a range of about 0.01 µm to about 0.1 µm. In some embodiments, disposal of the dielectric liner 154 comprises a low temperature oxidation process.

Figure 3E:
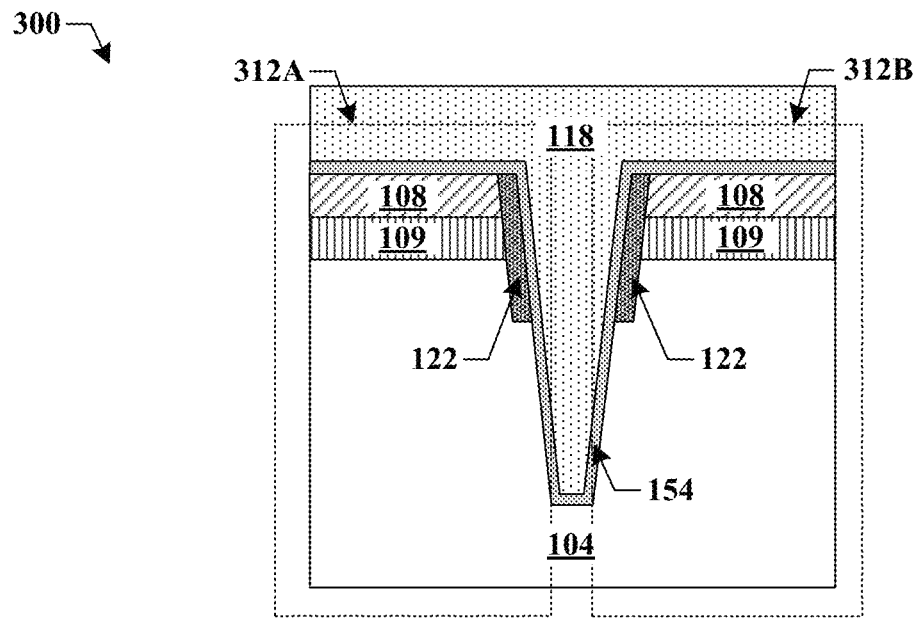

In FIG. 3E, the deep trench 310 is filled with a fill material 118 (e.g., oxide, tungsten) to form a boundary between a pair of photosensitive pixels 312A, 312B formed within the semiconductor substrate 104.

Figure 3F:
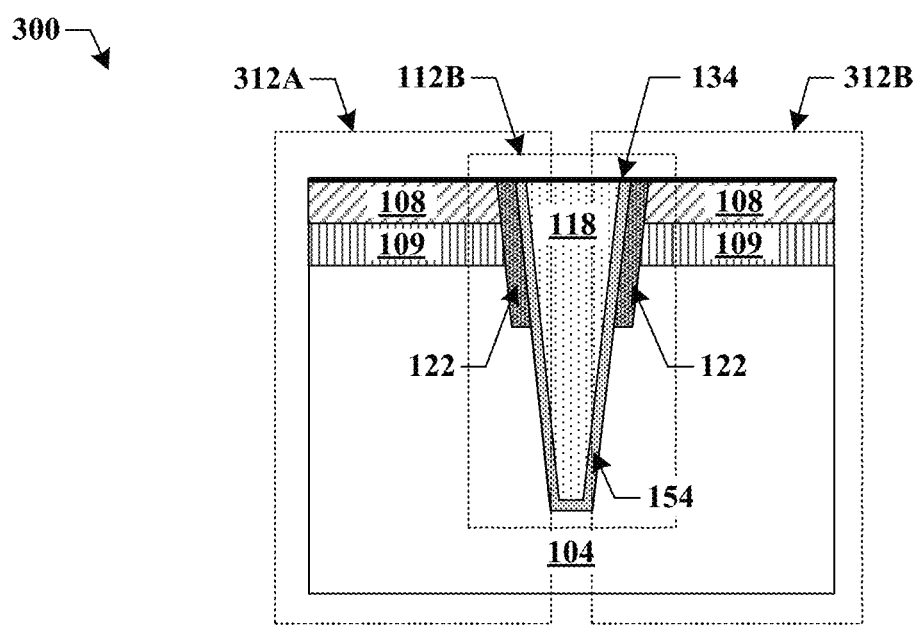

In FIG. 3F, the upper capping surface 134 is subjected to a planarization process (i.e., a CMP) to remove excess fill material 118, resulting in the DTI structure.

Figure 4:
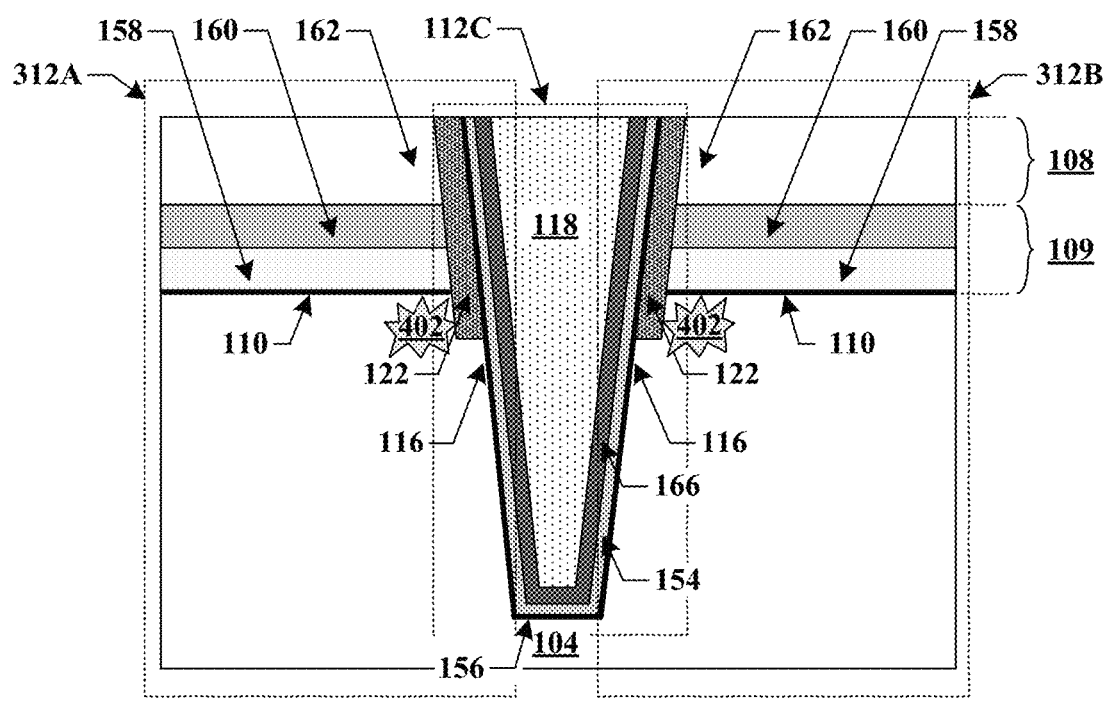
FIG. 4 illustrates a cross-sectional view of a DTI structure in accordance with some embodiments.

FIG. 4 illustrates a cross-sectional view a photovoltaic device 400 comprising a functional layer 109 disposed on an upper semiconductor surface 110 of a semiconductor substrate 104, and a capping layer 108 disposed over the functional layer 109. The functional layer 109 is formed by sequentially disposing an anti-reflective layer 158 (e.g., $HfO_2$) over the upper semiconductor surface 110 and disposing a passivation layer 160 (e.g., $Ta_2O_5$) over the anti-reflective layer 158. The capping layer 108 is formed by disposing an oxide layer 162 (e.g., $SiO_2$) over the functional layer 109.

During formation of this device, the first etchant 304 etches the $HfO_2$ and $Ta_2O_5$ within the functional layer 109 to form contaminants 402 comprising tantalum (Ta) or hafnium (Hf), which can diffuse into the semiconductor substrate 104 through upper sidewalls 116 of the deep trench during the first etch. Therefore, a wet clean is performed prior to exposing the semiconductor substrate 104 to the second etchant 308 to remove the contaminants 402 from within the upper portion of the recess. The protective sleeve 122 is formed after the wet clean, and prevents further etching of the functional layer 109 by the second etchant 308.

After the protective sleeve is formed, a second etch is carried out to deepen the trench. The dielectric liner 154 (e.g., $HfO_2$) is then formed along the lower surface 156 and the sidewalls 116 of the deep trench, and a seed layer 166 (e.g., TiN) is disposed over the dielectric liner 154. Tungsten is then used to fill the remainder of the deep trench.

Figure 5:
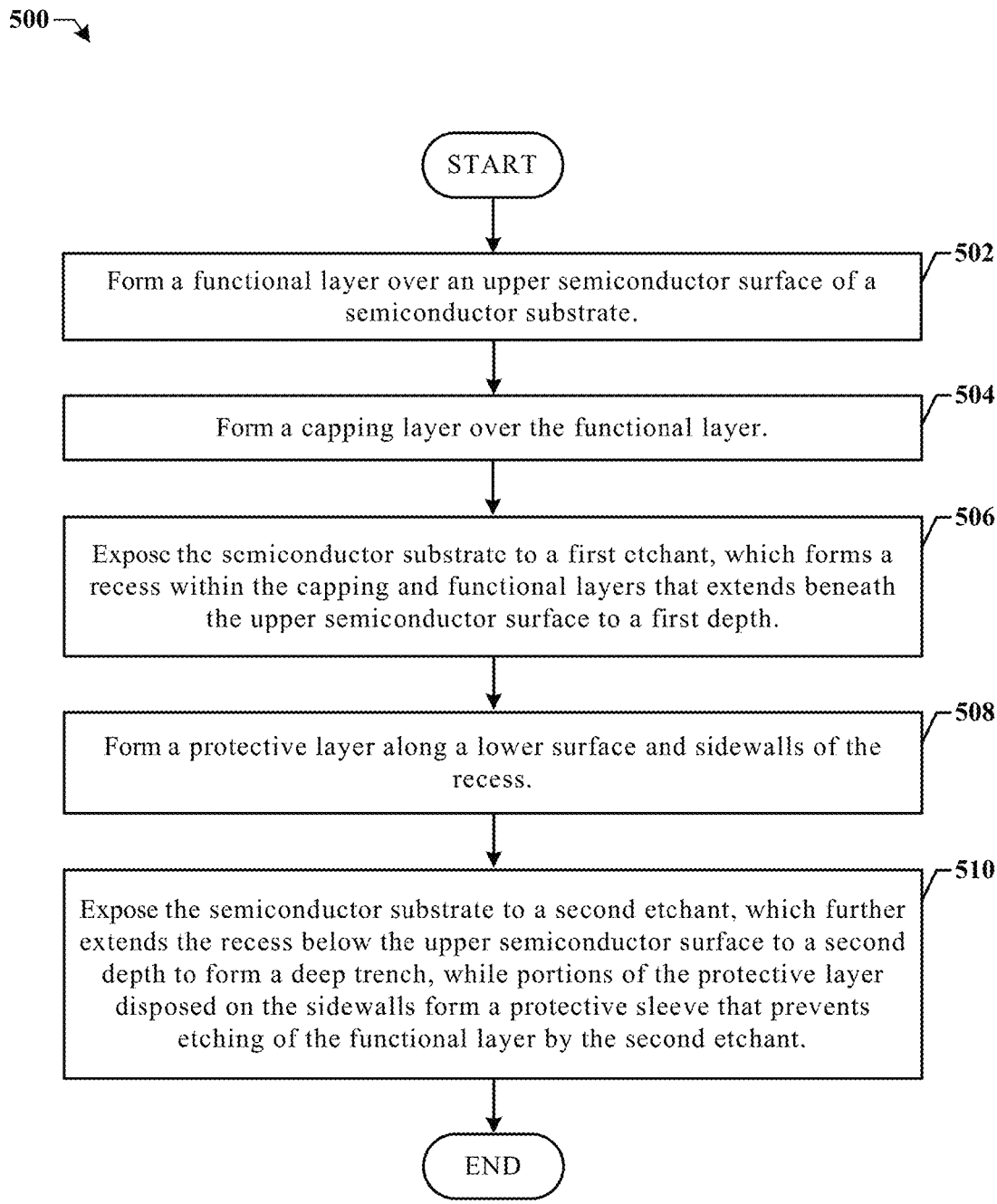
FIG. 5 illustrates a method of forming a DTI structure in accordance with some embodiments.

FIG. 5 illustrates a method 500 of forming a DTI structure in accordance with some embodiments.

At 502 a functional layer is formed over an upper semiconductor surface of a semiconductor substrate. In some embodiments, the functional layer comprises a $Ta_2O_5$ passivation layer. In some embodiments, the functional layer comprises an $Ox/HfO_2$ anti-reflective layer.

At 504 a capping layer is formed over the functional layer. In some embodiments, the capping layer comprises oxide configured to withstand a planarization step (e.g., a CMP), after formation of the DTI structure.

At 506 the upper semiconductor surface is exposed to a first etchant, which forms a recess within the capping and functional layers that extends beneath the upper semiconductor surface to a first depth. In various embodiments, the first etchant comprises a fluorine ($F_2$), chlorine ($Cl_2$), or hydrogen bromide (HBr) based etch chemistry.

At 508 a protective layer is formed along a lower surface and sidewalls of the recess. The protective layer is configured to shield exposed sidewalls of the functional layer during subsequent etch steps. In various embodiments, the protective layer comprises oxide (e.g., $SiO_2$), nitride (e.g., SiN), or a combination thereof. In some embodiments, the protective layer comprises a thickness in a range of about 0.001 µm to about 0.01 µm.

At 510 the semiconductor substrate is exposed to a second etchant, which further extends the recess below the upper semiconductor surface to a second depth to form a deep trench. In various embodiments, the second etchant comprises a fluorine ($F_2$) based etch chemistry configured to achieve a high-aspect-ratio etch profile. The second etchant removes portions of the protective layer disposed on a lower surface of the recess, while portions disposed on the sidewalls of the recess remain intact to form a protective sleeve that prevents etching of the functional layer. The protective sleeve prevents contaminant egression from the functional layer resulting from exposure to the second etchant, which reduces white pixel (WP) effects. The protective sleeve also reduces the recess width prior to exposing the semiconductor substrate to the second etchant, such that the deep trench is narrowed by the protective sleeve to have a deep trench width as measured between edges of the protective layer. The reduction in the deep trench width increases the amount of incident radiation absorbed by the semiconductor substrate, which consequently increases the quantum efficiency (QE) of a photovoltaic device formed within the semiconductor substrate.

Therefore, some embodiments of the present disclosure relate to a deep trench isolation (DTI) structure configured to enhance efficiency and performance of a photovoltaic device. The photovoltaic device comprises a functional layer disposed over an upper surface of a semiconductor substrate, and a pair of pixels formed within the semiconductor substrate, which are separated by the DTI structure. The DTI structure is arranged within a deep trench. Sidewalls of the deep trench are partially covered with a protective sleeve formed along the functional layer prior to etching the deep trench. The protective sleeve prevents etching of the functional layer while etching the deep trench, which prevents contaminants from penetrating the pair of pixels. The protective sleeve also narrows the width of the DTI structure, which increases pixel area and subsequently the efficiency and performance of the photovoltaic device.

Some embodiments relate to a deep trench isolation (DTI) structure, comprising a semiconductor substrate having an upper semiconductor surface. A functional layer is disposed over the upper semiconductor surface, and a capping layer is disposed over the functional layer. A deep trench, which has a deep trench width as measured between opposing deep trench sidewalls, is formed through the capping and functional layers, and extending beneath the upper semiconductor surface to a first depth. A fill material fills the deep trench, and a protective sleeve arranged partially along the sidewalls of the deep trench between the fill material and the functional layer.

Other embodiments relate to a photovoltaic device, comprising a semiconductor substrate having an upper semiconductor surface. A functional layer is disposed over the upper semiconductor surface, and a capping layer is disposed over the functional layer. A pair of pixels are formed within the semiconductor substrate, and configured to produce a current by absorbing incident radiation. A deep trench, which has a deep trench width as measured between opposing deep trench sidewalls, and is configured to isolate the pair of pixels from one-another, is formed though the capping layer and extending beneath the upper semiconductor surface to a first depth. A fill material fills the deep trench, and a protective sleeve arranged partially along the sidewalls of the deep trench between the fill material and the functional layer.

Still other embodiments relate to a method of forming a photovoltaic device, comprising forming a functional layer over an upper semiconductor surface of a semiconductor substrate. The method further comprises using a first etchant to form a recess within the functional layer, wherein the recess has a first depth and exposes a portion of the semiconductor substrate therethrough. The method further comprises forming a protective layer along a lower surface and sidewalls of the recess. The method further comprises using a second etchant to extend the recess below the upper semiconductor surface to a second depth to form a deep trench, while the protective layer disposed on the sidewalls prevents etching of the functional layer.

While method 500 has been described as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Further, spatially relative terms, such as "over," "on," "beneath," "below," "lower," "above," "upper" and the like, have been used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A deep trench isolation (DTI) structure, comprising:
   a semiconductor substrate having an upper semiconductor surface;
   a functional layer disposed over the upper semiconductor surface;
   a capping layer disposed over the functional layer;
   a deep trench, which has a deep trench width as measured between opposing deep trench sidewalls, formed through the capping and functional layers, and extending beneath the upper semiconductor surface to a first depth;
   a fill material in the deep trench; and
   a protective sleeve extending into the semiconductor substrate and partially along the sidewalls of the deep trench between the fill material and the functional layer; and
   a dielectric liner arranged along a lower surface and the sidewalls of the deep trench, the dielectric liner being arranged between innermost sidewalls of the protective sleeve and corresponding outer sidewalls of the fill material to separate the innermost sidewalls of the protective sleeve from the corresponding outer sidewalls of the fill material.

2. The DTI structure of claim 1, wherein the protective sleeve extends along the sidewalls beneath the upper semiconductor surface to a second depth, which is less than the first depth.

3. The DTI structure of claim 1, wherein the protective sleeve comprises silicon nitride or silicon dioxide.

4. The DTI structure of claim 1, wherein the dielectric liner comprises hafnium oxide ($HfO_2$).

5. The DTI structure of claim 1, wherein the functional layer comprises a hafnium oxide ($HfO_2$) layer configured as an anti-reflective coating.

6. The DTI structure of claim 5, wherein the functional layer comprises a tantalum oxide ($Ta_2O_5$) layer disposed over the $HfO_2$ layer, and configured to passivate an upper surface of the $HfO_2$ layer.

7. The DTI structure of claim 1, wherein the capping layer comprises an oxide layer.

8. The DTI structure of claim 1, wherein upper surfaces of the capping layer, protective sleeve, dielectric liner, and fill material are co-planar with one another.

9. The DTI structure of claim 1, wherein the dielectric liner comprises hafnium oxide ($HfO_2$) doped with aluminum (Al), tantalum (Ta), cobalt (Co), or germanium (Ge).

10. The DTI structure of claim 1, wherein outer sidewalls of the protective sleeve directly contact inner sidewalls of the functional layer.

11. A photovoltaic device, comprising:
    a semiconductor substrate having an upper semiconductor surface;
    a functional layer disposed over the upper semiconductor surface;
    a capping layer disposed over the functional layer;
    a pair of pixels formed within the semiconductor substrate, and configured to produce a current by absorbing incident radiation;
    a deep trench, which has a deep trench width as measured between opposing deep trench sidewalls, and which is configured to isolate the pair of pixels from one-another, formed through the capping layer and extending beneath the upper semiconductor surface to a first depth;
    a fill material in the deep trench; and
    a protective sleeve arranged partially along the sidewalls of the deep trench between the fill material and the functional layer, wherein upper surfaces of the capping layer, protective sleeve, and fill material are co-planar with one another.

12. The photovoltaic device of claim 11, further comprising a dielectric liner disposed on a lower surface and sidewalls of the deep trench, the dielectric liner being arranged between innermost sidewalls of the protective sleeve and corresponding outer sidewalls of the fill material, to separate the outer sidewalls of the fill material from the innermost sidewalls of the protective sleeve.

13. The photovoltaic device of claim 12, wherein an upper surface of the dielectric liner is co-planar with the upper surfaces of the capping layer, protective sleeve, and fill material.

14. The photovoltaic device of claim 11, wherein the functional layer comprises hafnium oxide ($HfO_2$) configured as an anti-reflective coating.

15. The photovoltaic device of claim 11, wherein the functional layer comprises tantalum oxide ($Ta_2O_5$) configured as a passivation layer.

16. A device, comprising:
    a semiconductor substrate having an uppermost semiconductor surface;
    a functional layer disposed over the uppermost semiconductor surface;
    a capping layer disposed over the functional layer;
    a trench structure extending downwardly from an uppermost surface of the capping layer, and through the capping and functional layers, wherein the trench structure includes upper trench sidewalls extending beneath the uppermost semiconductor surface to an intermediate trench depth in the semiconductor substrate and lower trench sidewalls extending from the intermediate trench depth to a lowermost trench depth, the upper trench sidewalls being spaced apart by a first trench width at the uppermost semiconductor surface and the lower trench sidewalls being spaced apart by a second trench width at the lowermost trench depth and which is less than the first trench width;
    a protective sleeve structure arranged along upper sidewalls of the trench structure to separate the upper sidewalls of the trench structure from inner sidewalls of the capping and functional layers, wherein the protective sleeve structure terminates at the intermediate trench depth;
    wherein upper surfaces of the trench structure, the protective sleeve structure, and the capping layer are co-planar with one another.

17. The device of claim 16, wherein outer sidewalls of the protective sleeve structure directly contact inner sidewalls of the functional layer.

18. The device of claim 17, wherein the outer sidewalls of the protective sleeve structure directly contact inner sidewalls of the capping layer such that the functional layer is entirely sealed off from the trench structure.

19. The device of claim 18, wherein the trench structure is a continuous body of dielectric material whose upper outer sidewalls directly contact innermost sidewalls of the protective sleeve structure.

20. The device of claim 16, further comprising:
   a fill material in the trench structure; and
   a dielectric liner arranged along the lower trench sidewalls and continuing upwardly along the upper trench sidewalls, the dielectric liner being arranged between innermost sidewalls of the protective sleeve structure and outer sidewalls of the fill material to separate the innermost sidewalls of the protective sleeve structure from the outer sidewalls of the fill material.

21. The device of claim 20, wherein upper surfaces of the capping layer, protective sleeve structure, dielectric liner, and fill material are co-planar with one another.

\* \* \* \* \*